(12) United States Patent
Tsukatani et al.

(10) Patent No.: US 7,816,013 B2
(45) Date of Patent: Oct. 19, 2010

(54) WAFER

(75) Inventors: Toshihiko Tsukatani, Tokyo (JP);
Masaru Konya, Tokyo (JP); Noriaki Hamaya, Tokyo (JP); Hajime Nakano, Tokyo (JP); Takao Maeda, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/326,310

(22) Filed: Dec. 2, 2008

(65) Prior Publication Data

US 2009/0142605 A1    Jun. 4, 2009

(30) Foreign Application Priority Data

Dec. 4, 2007  (JP) ............................ 2007-313404
Dec. 4, 2007  (JP) ............................ 2007-313407
Dec. 4, 2007  (JP) ............................ 2007-313412

(51) Int. Cl.
*B32B 9/04*     (2006.01)
*B32B 9/06*     (2006.01)
*B32B 13/04*    (2006.01)

(52) U.S. Cl. ..................................... 428/446; 428/448

(58) Field of Classification Search ................ 428/696, 428/698, 701, 702, 446, 448
See application file for complete search history.

(56) References Cited

U.S. PATENT DOCUMENTS

| 6,274,500 | B1* | 8/2001 | Xuechun et al. ............. 438/706 |
| 6,299,988 | B1* | 10/2001 | Wang et al. .................. 428/632 |
| 6,632,549 | B1* | 10/2003 | Ohashi et al. ............... 428/698 |
| 2004/0126614 | A1* | 7/2004 | Maeda et al. ............... 428/688 |
| 2007/0111030 | A1* | 5/2007 | Nakano et al. ............. 428/696 |
| 2009/0108414 | A1* | 4/2009 | Tsukatani et al. ........... 257/632 |

FOREIGN PATENT DOCUMENTS

| JP | 9-45751 A | 2/1997 |
| JP | 2003-86475 A | 3/2003 |

\* cited by examiner

*Primary Examiner*—Jennifer C McNeil
*Assistant Examiner*—Jonathan C Langman
(74) *Attorney, Agent, or Firm*—Westerman, Hattori, Daniels & Adrian, LLP

(57) ABSTRACT

A wafer has a rare earth fluoride coating disposed, typically sprayed on a substrate as an outermost layer, the rare earth fluoride being selected from lanthanoid fluorides, yttrium fluoride, and scandium fluoride. It is useful as a dummy wafer in a plasma etching or deposition system.

5 Claims, 1 Drawing Sheet

YTTRIUM FLUORIDE SPRAY LAYER

SILICON SPRAY LAYER

SILICON SUBSTRATE

WAFER

CROSS-REFERENCE TO RELATED APPLICATION

This non-provisional application claims priority under 35 U.S.C. §119(a) on Patent Application Nos. 2007-313404, 2007-313407 and 2007-313412 filed in Japan on Dec. 4, 2007, Dec. 4, 2007 and Dec. 4, 2007, respectively, the entire contents of which are hereby incorporated by reference.

TECHNICAL FIELD

This invention relates to wafers, typically dummy wafers, which are required to have high resistance to corrosive gases or plasmas thereof during the semiconductor fabrication process, and more particularly to dummy wafers suitable for use in a halogen gas or plasma atmosphere.

BACKGROUND ART

Semiconductor devices are fabricated through various processes including dry etching and deposition processes, many of which resort to plasma techniques. In the plasma processes, highly reactive, corrosive halogen-based gases such as fluorine or chlorine-based gases are often used for the purposes of etching, deposition and cleaning.

For more efficient semiconductor fabrication, it is desired to increase the operation efficiency of these plasma systems. The operation efficiency of plasma systems can be increased by reducing the downtime of systems, which is achieved, for example, by reducing the frequency of wet cleaning of chamber components.

One means for reducing the frequency of wet cleaning is plasma cleaning. That is, any foreign deposits on the reaction chamber resulting from a dry etching or deposition process are removed by applying a suitable gas plasma to reaction products for decomposition or sublimation thereof, and exhausting the decomposed or sublimated products. The plasma cleaning is effective in reducing the frequency of wet cleaning to some extent. When such plasma cleaning is performed, it is essential to place a dummy wafer on a wafer chuck including the lower electrode within the chamber so as to prevent the lower electrode from direct exposure to the plasma. Even after the plasma cleaning, it is also necessary to hold the dummy wafer within the chamber for the purpose of positively expelling the particles remaining on the inner wall and other members of the chamber and the cleaning gas.

For consistent fabrication of semiconductor devices, the processing system is desired to keep a stable plasma state. In the plasma system, however, the temperature is unstable because plasma treatment entails heat accumulation so that the system interior undergoes a temperature rise or variation at the initial stage of operation. Thus, at the initial stage of operation, a plasma treatment equivalent to the actual process, which is known as dummy treatment, is carried out on a plurality of dummy wafers for the purpose of minimizing a temperature change and keeping the system temperature stable. The dummy treatment is implemented not only for the purpose of stabilizing the system temperature, but also for the purposes of stabilizing the processing atmosphere and pressure prior to execution of etching treatment on substrates, testing system operation, and cleaning and seasoning (or aging) after cleaning. The dummy treatment is also implemented for determining the process conditions for a lot of substrates.

Since process parameters of the system, especially the etching rate of dry etching process, remain unstable immediately after power-on, dummy treatment is also carried out for the purpose of stabilizing the system performance. Also in this case, it is essential to place a dummy wafer within the chamber so as to prevent the lower electrode from being damaged by the plasma treatment.

Such dummy wafers are required to have high corrosion resistance and strength because they are brought in contact with corrosive gases and plasmas. Dummy wafers are generally made of silicon, quartz or the like.

More rigorous conditions are now employed for achieving the goal of improved productivity. For example, cleaning gases of higher corrosive nature are used to further reduce the cleaning time, rapid heating is used to reduce the heating time, and so on.

While silicon wafers or dummy wafers in the form of silicon wafers having a silicon oxide coating formed thereon and quartz wafers are used in the prior art, they have insufficient resistance to highly corrosive cleaning gases and etching gases and fail to inhibit dusting or contamination. These wafers are susceptible to thickness reduction by the cleaning gases and etching gases.

To solve the above and other problems, dummy wafers of alumina ceramics and dummy wafers of yttria-alumina compound-based ceramics (JP-A 2003-86475) were proposed. Undesirably alumina forms aluminum fluoride particles when contacted with fluorine-based gases such as $SF_6$, $CF_4$, $CHF_3$, $ClF_3$, HF, and $C_2F_8$. Additionally, ceramic wafers of alumina or yttria-alumina compounds are expensive because of many problems including a very long time of sintering, a long time of heating and cooling, low yields, and difficulty of productivity improvement. JP-A 9-45751 also discloses a dummy wafer.

DISCLOSURE OF THE INVENTION

An object of the invention is to provide a dummy wafer having high resistance to extremely corrosive cleaning and etching gases and a long service life in such an environment.

The inventors have found that when a lanthanoid fluoride, yttrium fluoride or scandium fluoride coating is disposed, or specifically sprayed, as an outermost layer on a substrate, typically a silicon substrate, the resulting wafer exhibits high corrosion resistance in a halogen-based gas or halogen-based plasma atmosphere and is suited for use as a dummy wafer.

In a first aspect, the invention provides a wafer comprising a substrate and a rare earth fluoride coating disposed on the substrate as an outermost layer, the rare earth fluoride being selected from lanthanoid fluorides, yttrium fluoride, and scandium fluoride.

In a preferred embodiment, the rare earth fluoride coating is a sprayed coating. The substrate is typically a silicon substrate. The wafer may further comprise at least one intermediate layer between the substrate and the rare earth fluoride coating, and more preferably, the intermediate layer may comprise an element selected from among silicon, tungsten, tantalum, molybdenum, zirconium, and titanium. The lanthanoid is preferably one or multiple elements selected from among La, Ce, Pr, Nd, Sm, Eu, Gd, Tb, Dy, Ho, Er, Tm, Yb, and Lu.

The wafer is often used in a halogen-based gas or plasma atmosphere. The wafer is typically used as a dummy wafer in a semiconductor fabrication process.

BENEFITS OF THE INVENTION

When the wafer of the invention is placed in a plasma etching system or plasma deposition system, it undergoes no or little thickness reduction during cleaning or stabilizing operation of the system. It has a prolonged lifetime and is useful as a dummy wafer.

DESCRIPTION OF THE PREFERRED EMBODIMENT

Figure 1:
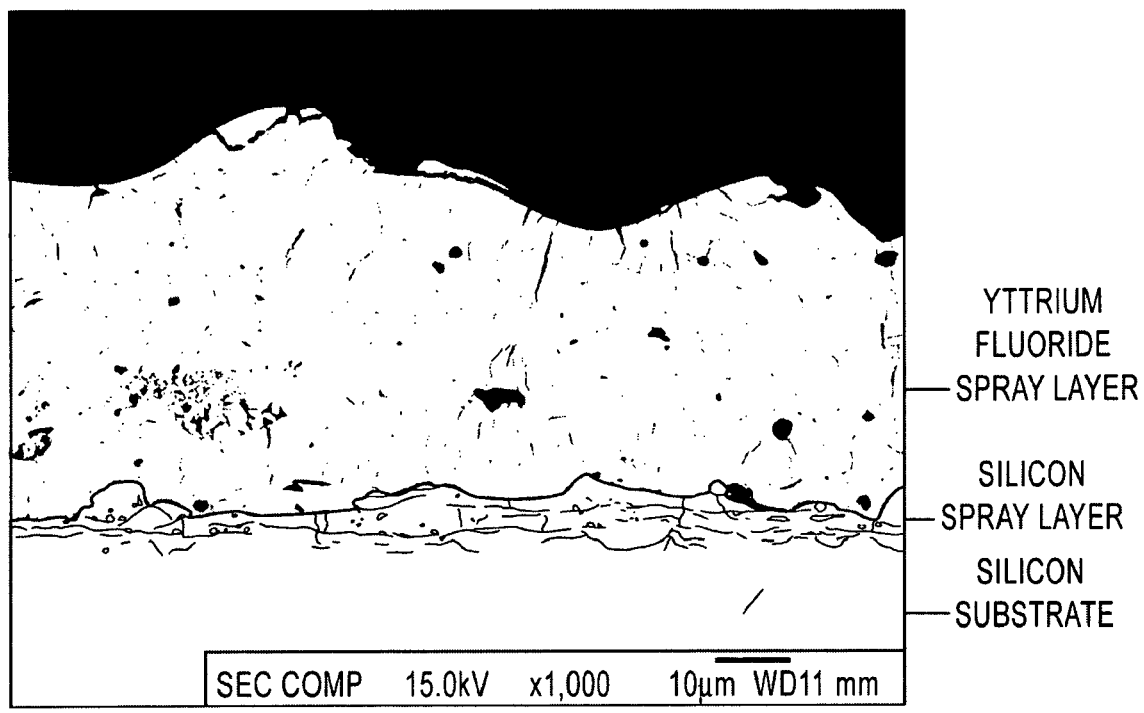
FIG. 1 shows a photograph of a cross-section of wafer in Example 15 by a scanning electron microscope.

The substrate used herein may be selected from semiconductor substrates such as silicon (Si), silicon carbide (SiC), gallium phosphide (GaP), gallium arsenide phosphide (GaAsP), gallium aluminum arsenide (GaAlAs), gallium nitride (GaN), and ceramic substrates such as alumina ceramics, alumina-based ceramics and quartz. The invention is characterized by a corrosion resistant coating disposed on such a substrate, typically a silicon substrate. The substrate generally has a thickness of about 0.5 mm to about 1.5 mm. The substrate, typically silicon substrate may include a silicon dioxide layer formed thereon as a result of thermal oxidation, because the corrosion resistant coating can be formed on the substrate even in the presence of the silicon dioxide layer, that is, on the silicon dioxide layer. According to the invention, the corrosion resistant coating is made of a rare earth fluoride selected from lanthanoid fluorides, yttrium fluoride, and scandium fluoride.

In the invention, the wafer, specifically dummy wafer has a rare earth fluoride coating disposed on a substrate, typically a silicon substrate. The rare earth fluoride coating is made of lanthanoid fluoride, yttrium fluoride or scandium fluoride and preferably has a thickness of 1 to 2,000 μm, and more preferably 10 to 1,000 μm.

In general, rare earth fluoride layers may be formed on substrates by various deposition methods including physical vapor phase deposition methods such as sputtering, evaporation and ion plating, chemical vapor phase deposition methods such as plasma CVD and pyrolytic CVD, coating, and thermal spraying. Since the rare earth fluoride coating is relatively thick, specifically 1 μm or more, the PVD and CVD methods require extended periods of time until the desired thickness is reached and are thus uneconomical. In addition, PVD and CVD apparatus are expensive, adding to the manufacture cost. For this reason, it is desired to select thermal spraying. Notably, a coating of equivalent corrosion resistance may be deposited by a cold spraying method.

The rare earth fluoride is selected from lanthanoid fluorides, yttrium fluoride, and scandium fluoride while the lanthanoid is selected from among La, Ce, Pr, Nd, Sm, Eu, Gd, Tb, Dy, Ho, Er, Tm, Yb, and Lu, and mixtures of two or more of the foregoing elements. A fluoride composite of the lanthanoid and Y or Sc can also be used.

The thermal spraying method is described in detail. When it is desired to spray a rare earth fluoride layer on a substrate, pretreatments, for example, roughening by air blasting techniques using alumina, silicon carbide, zircon, glass beads, quartz or the like, and roughening by wet techniques using etchants based on a mixed acid of hydrofluoric acid and nitric acid may fail to provide a surface state sufficient to deposit a rare earth fluoride layer thereon. It is sometimes difficult to spray a rare earth fluoride layer directly on such a silicon substrate. The inventors have found that if a bond coat layer is formed on a substrate, then a rare earth fluoride layer can be deposited on the substrate as a firmly bonded, durable, outermost layer. The bond coat layer may be formed by roughening a silicon substrate by air blasting, acid treatment or the like, and presents a sufficient surface roughness to adhesively bond a rare earth fluoride layer. The bond coat layer may include at least one layer of a metal such as Si, Mo, W, Ta, Ti or Zr or a resin. Of these, a silicon layer is preferred since it ensures a tight bond between the substrate and the fluoride layer.

It is not critical how to form the bond coat layer. Chemical vapor deposition (CVD), sputtering, and thermal spraying methods may be used, with the thermal spraying being preferred. The bond coat layer may have a thickness of about 3 μm to about 100 μm.

Then a rare earth fluoride layer is formed desirably by thermal spraying. The thermal spraying method may be performed in any atmospheres and include air spraying, controlled atmosphere spraying, low pressure spraying and the like. While the distance between the spray nozzle and the substrate and the traverse speed of the spray gun are controlled, a source powder having an average particle size of 1 to 150 μm is fed from a source powder feeder to the gun until the deposit builds up to a desired thickness. The sprayed material may be deposited to a desired thickness by controlling the traverse speed of the spray gun, the feed rate of source powder, and the number of repeated deposition passes. Even a coating as thick as 2 mm can be easily deposited.

From these considerations, a thermal spraying method capable of depositing a fluoride coating of 1 to 2,000 μm thick within a relatively short time is employed in the practice of the invention.

Thermal spraying of rare earth fluoride is possible independent of whether the wafer shape is of orientation flat type or notch type. Also the thermal spraying is not limited by the wafer diameter.

One embodiment of the invention is described. The starting wafer serving as a substrate is preferably pretreated to roughen its surface to increase its receptivity to a bond coat layer, typically a sprayed coating. Suitable roughening treatments include air blasting using abrasives of alumina, silicon carbide, zircon, glass beads, quartz or the like, and wet treatment with etchants based on a mixed acid of hydrofluoric acid (HF) and nitric acid ($HNO_3$). The roughening treatment is not particularly limited as long as the adhesive bonding (or receptivity) to a subsequently sprayed coating is fully enhanced. In the case of air blasting, an air pressure of 0.01 to 0.2 MPa is preferred for preventing the wafer edge from chipping away. An air pressure in excess of 0.2 MPa may cause chipping of the wafer edge. After the roughening treatment, the substrate preferably has a surface roughness Ra of 0.5 to 5 μm according to the JIS standard.

The bond coat layer is preferably of the same material as the substrate or another coating layer from the standpoint of avoiding entry of any foreign matter as an impurity source into the plasma process chamber. For a silicon substrate, a silicon bond coat layer is preferably formed. In this case, suitable materials of which the bond coat layer is made have impurities in a smaller amount, especially the following amounts of impurities:

Fe<100 ppm,

Al<500 ppm,
Ca<100 ppm,
Ni<50 ppm,
Cr<50 ppm,
Zr<50 ppm,
Na<50 ppm, and
K<50 ppm.

The bond coat layer is preferably formed by a spraying technique, which can form a layer with a rough surface enough to receive any overlying layer in tight bond. The bond coat layer preferably has a surface roughness Ra of 1 to 10 μm. The bond coat layer may have any suitable thickness to provide a surface roughness in the range. The formation of a bond coat layer having a surface roughness Ra of 1 to 10 μm facilitates subsequent deposition of a rare earth fluoride coating thereon.

Then the rare earth fluoride coating may be formed on either one surface or both surfaces of the substrate by air spraying, controlled atmosphere spraying, low pressure spraying or the like. The rare earth fluoride coating preferably has a thickness of 1 to 2,000 μm, and more preferably 10 to 1,000 μm. Coatings of less than 1 μm are difficult to deposit whereas coatings in excess of 2,000 μm may give rise to the problem of interference with the gate or wafer inlet/outlet port of the plasma processing vessel.

The resulting wafer having a rare earth fluoride coated deposited thereon is desirably controlled to have the same thickness as semiconductor wafers because the wafer is advantageously used as a dummy wafer in the semiconductor fabrication process.

EXAMPLE

Examples of the invention are given below by way of illustration and not by way of limitation. The average particle size is measured by an instrument Microtrack FRA without dispersion.

Example 1

A 8-inch silicon substrate (silicon wafer) of 725 μm thick was roughened by air blasting of alumina abrasive grits having an average particle size of 100 μm under a pressure of 0.03 MPa. The silicon substrate as blasted had a surface roughness Ra of 1.1 μm. A bond coat layer was then deposited on the silicon substrate by means of an air plasma spraying apparatus which was fed with a silicon powder having an average particle size of 30 μm and argon gas as the plasma gas, and operated at a power of 40 kW, a spraying distance of 120 mm and a deposition rate of 5 μm/pass. The silicon layer was deposited to a thickness of 10 μm. The sprayed silicon layer had a surface roughness Ra of 3.3 μm when measured by a surface roughness meter E-35 A (Tokyo Seimitsu Co., Ltd.).

It was confirmed by EPMA that the spray layer was silicon layer.

The amounts of impurities in the silicon powder were measured by ICP emission spectrometry (inductively coupled plasma). The results are as follows:
Fe: 25 ppm
Al: 280 ppm
Ca: 22 ppm
Ni: <5 ppm
Cr: <2 ppm
Zr: <5 ppm
Na: <5 ppm
K: <5 ppm Next, lanthanum fluoride was sprayed on the silicon layer on the silicon substrate by means of an air plasma spraying apparatus which was fed with a lanthanum fluoride powder having an average particle size of 40 μm and argon gas as the plasma gas, and operated at a power of 40 kW, a spraying distance of 120 mm and a deposition rate of 20 μm/pass. The lanthanum fluoride layer deposited had a thickness of 40 μm and a surface roughness Ra of 4.9 μm. The silicon wafer having a corrosion resistant lanthanum fluoride layer deposited thereon was subject to ultrasonic cleaning in ultra-pure water at 40 kHz and dried at 80° C., whereupon it was ready for use.

A 20 mm×20 mm piece was cut out of the wafer and surface polished to be flat and smooth. A half section of the corrosion resistant layer was masked with polyimide tape before the piece was subjected to a plasma etching test. The etching test run on an etching system PD-2S (Samco Inc.) at 20 mL/min of $CF_4$, 5 mL/min of $O_2$, a chamber inner pressure of 40 Pa and a power of 50 W for one hour. At the end of the etching test, the polyimide masking tape was stripped off. The test piece was measured by Dektak 3ST available from Veeco Instruments Corp., finding that the step between the masked and exposed sections was not recognized. The result is shown in Table 1.

Examples 2 to 14

By the same procedure as in Example 1, fluoride layers were deposited on silicon substrates using various lanthanoid fluoride powders. The resulting wafers were tested as in Example 1, with the results shown in Table 1.

Comparative Example 1

A silicon substrate with mirror finish was roughened by air blasting of alumina abrasive grits having an average particle size of 100 μm under a pressure of 0.2 MPa. The substrate as blasted was found chipped at the edge.

Comparative Example 2

A 20 mm×20 mm piece was cut out of a silicon substrate. A half section of the mirror finish surface was masked with polyimide tape before the piece was subjected to the same plasma etching test as in Example 1. The step on the test piece was observed as in Example 1, finding that the exposed section was etched to a depth of 12 μm.

Comparative Example 3

A 20 mm×20 mm piece was cut out of a 8-inch alumina substrate of 725 μm thick. The piece was partly masked with polyimide tape and then subjected to the same plasma etching test as in Example 1. The step on the test piece was observed as in Example 1, finding that the exposed section was etched to a depth of 4.9 μm.

TABLE 1

|  | Etch depth (μm) |
| --- | --- |
| Example 1 (La, lanthanum) | <0.1 |
| Example 2 (Ce, cerium) | <0.1 |
| Example 3 (Pr, praseodymium) | <0.1 |
| Example 4 (Nd, neodymium) | <0.1 |
| Example 5 (Sm, samarium) | <0.1 |
| Example 6 (Eu, europium) | <0.1 |
| Example 7 (Gd, gadolinium) | <0.1 |

TABLE 1-continued

| | Etch depth (μm) |
|---|---|
| Example 8 (Tb, terbium) | <0.1 |
| Example 9 (Dy, dysprosium) | <0.1 |
| Example 10 (Ho, holmium) | <0.1 |
| Example 11 (Er, erbium) | <0.1 |
| Example 12 (Tm, thulium) | <0.1 |
| Example 13 (Yb, ytterbium) | <0.1 |
| Example 14 (Lu, lutetium) | <0.1 |
| Comparative Example 1 | No deposit |
| Comparative Example 2 | 12 |
| Comparative Example 3 | 4.9 |

Example 15

A 8-inch silicon substrate of 725 μm thick was roughened by air blasting of alumina abrasive grits having an average particle size of 100 μm under a pressure of 0.03 MPa. The silicon substrate as blasted had a surface roughness Ra of 1.1 μm. A bond coat layer was then deposited on the silicon wafer by means of an air plasma spraying apparatus which was fed with a silicon powder having an average particle size of 30 μm and argon gas as the plasma gas, and operated at a power of 40 kW, a spraying distance of 120 mm and a deposition rate of 5 μm/pass. The silicon layer was deposited to a thickness of 10 μm. The sprayed silicon layer had a surface roughness Ra of 3.3 μm when measured by a surface roughness meter E-35 A (Tokyo Seimitsu Co., Ltd.).

Next, yttrium fluoride was sprayed on the silicon layer on the silicon substrate by means of an air plasma spraying apparatus which was fed with a yttrium fluoride powder having an average particle size of 45 μm and argon gas as the plasma gas, and operated at a power of 40 kW, a spraying distance of 120 mm and a deposition rate of 20 μm/pass. The yttrium fluoride layer deposited had a thickness of 50 μm and a surface roughness Ra of 4.9 μm. The silicon wafer having a corrosion resistant yttrium fluoride layer deposited was subject to ultrasonic cleaning in ultra-pure water at 40 kHz and dried at 75° C., whereupon it was ready for use.

Hydrochloric Acid Test

On yttrium oxide film (50 μm) or yttrium fluoride film (50 μm) was put a vinyl chloride resin tube in which 0.5 N hydrochloric acid was poured to leave to stand at 25° C. for 5 hours.

Yttrium eluation amount (ICP measurement)
Yttrium oxide: 4.7 g/L
Yttrium fluoride: 0.2 g/L Hydrofluoric Acid Test On yttrium oxide film (50 μm) or yttrium fluoride film (50 μm) was put a vinyl chloride resin tube in which 0.5 N hydrofluoric acid was poured to leave to stand at 25° C. for 5 hours.

Yttrium eluation amount (ICP measurement)
Yttrium oxide: 0.042 mg/L
Yttrium fluoride: 0.021 mg/L FIG. 1 shows a photograph of a cross-section of wafer by a scanning electron microscope (magnification ×1,000).

The wafer according to the present invention is suitable for use in a halogen gas or plasma atmosphere. In the plasma process, fluorine- or chlorine-based gas such as $SF_6$, $CF_4$, $CHF_3$, $ClF_3$, HF, $NF_3$, $Cl_2$, $BCl_3$, HCl, $CCl_4$, $SiCl_4$ and the like is used. In case that the reactivity between the fluorine- or chlorine-based gas or its plasma and a coating material is high, particles may occur from the coating material thereby causing contamination in a chamber. In order to investigate the reactivity with a halogen, a yttrium oxide sprayed film or the yttrium fluoride spray film obtained in Example 15 was contacted with hydrofluoric acid or hydrochloric acid to examine an amount of yttrium eluation. The results are shown below.

Example 16

A coated wafer was prepared as in Example 15 except that a yttrium fluoride layer having a thickness of 30 μm was deposited by spraying a yttrium fluoride powder having an average particle size of 20 μm at a rate of 10 μm/pass.

A 20 mm×20 mm piece was cut out of each of the wafers of Examples 15 and 16 and surface polished to be flat and smooth. A half section of the corrosion resistant layer was masked with polyimide tape before the piece was subjected to a plasma etching test. The etching test run on an etching system PD-2S (Samco Inc.) at 20 mL/min of $CF_4$, 5 mL/min of $O_2$, a chamber inner pressure of 40 Pa and a power of 50 W for one hour. At the end of the etching test, the polyimide masking tape was stripped off. The test piece was measured by Dektak 3ST available from Veeco Instruments Corp., finding that the step between the masked and exposed sections was not recognized. The result is shown in Table 2.

TABLE 2

| Yttrium fluoride | Etch depth (μm) |
|---|---|
| Example 15 | <0.1 |
| Example 16 | <0.1 |

Example 17

A 8-inch silicon substrate of 725 μm thick was roughened by air blasting of alumina abrasive grits having an average particle size of 100 μm under a pressure of 0.03 MPa. The silicon substrate as blasted had a surface roughness Ra of 1.1 μm. A bond coat layer was then deposited on the silicon wafer by means of an air plasma spraying apparatus which was fed with a silicon powder having an average particle size of 30 μm and argon gas as the plasma gas, and operated at a power of 40 kW, a spraying distance of 120 mm and a deposition rate of 5 μm/pass. The silicon layer was deposited to a thickness of 10 μm. The sprayed silicon layer had a surface roughness Ra of 3.3 μm when measured by a surface roughness meter E-35 A (Tokyo Seimitsu Co., Ltd.).

Next, scandium fluoride was sprayed on the silicon layer on the silicon substrate by means of an air plasma spraying apparatus which was fed with a scandium fluoride powder having an average particle size of 55 μm and argon gas as the plasma gas, and operated at a power of 40 kW, a spraying distance of 120 mm and a deposition rate of 20 μm/pass. The scandium fluoride layer deposited had a thickness of 55 μm and a surface roughness Ra of 5.0 μm. The silicon wafer having a corrosion resistant scandium fluoride layer deposited thereon was subject to ultrasonic cleaning in ultra-pure water at 40 kHz and dried at 75° C., whereupon it was ready for use.

Example 18

A coated wafer was prepared as in Example 17 except that a scandium fluoride layer having a thickness of 35 μm was deposited by spraying a scandium fluoride powder having an average particle size of 25 μm at a rate of 10 μm/pass.

A 20 mm×20 mm piece was cut out of each of the wafers of Examples 17 and 18 and surface polished to be flat and smooth. A half section of the corrosion resistant layer was masked with polyimide tape before the piece was subjected to a plasma etching test. The etching test run on an etching system PD-2S (Samco Inc.) at 20 mL/min of $CF_4$, 5 mL/min of $O_2$, a chamber inner pressure of 40 Pa and a power of 50 W for one hour. At the end of the etching test, the polyimide masking tape was stripped off. The test piece was measured by Dektak 3ST available from Veeco Instruments Corp., finding that the step between the masked and exposed sections was not recognized. The result is shown in Table 3.

TABLE 3

| Scandium fluoride | Etch depth (μm) |
|---|---|
| Example 17 | <0.1 |
| Example 18 | <0.1 |

Example 19

The procedure of Example 18 was repeated except that the thickness of yttrium fluoride ($YF_3$) was changed to 25 μm, 45 μm and 70 μm to prepare coated wafers. The change of warpage of the wafer was observed by the following method. The results are shown in Table 4.

Figure 2:
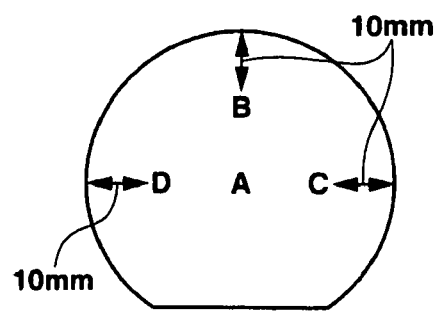
FIG. 2 shows an example of a wafer.

In the wafer shown in FIG. 2, the warpage was obtained by measuring the height at each position A to D using three-dimensional coordinate measuring machine available from TOKYO SEIMITSU CO., LTD. and calculating according to the following equation.

$$\text{Warpage} = H_A - \frac{(H_B + H_C + H_D)}{3}$$

$H_A$ to $H_D$ show the height at positions A to D respectively. In this case, position A is the center of the wafer and positions B to D are the positions at 10 mm apart from the circumference of the wafer toward the center, as is shown in FIG. 2.

The results are shown in Table 4.

TABLE 4

| Sample | Warpage (mm) |
|---|---|
| Non-treated silicon wafer | −0.0056 |
| After blasting | 0.2080 |
| After spraying 10 μm of silicon | 0.0972 |
| After spraying 25 μm of yttrium oxide | 0.0124 |
| After spraying 45 μm of yttrium oxide | −0.0822 |
| After spraying 70 μm of yttrium oxide | −0.1785 |

As is evident from the above results, the formation of yttrium oxide spray coating film can minimize a warpage of 0.1 mm or less for a 8-inch wafer.

Example 20 and 21

Example 15 was repeated except that tungsten (W) powder having an average particle size of 15 μm (Example 20) or titanium (Ti) powder having an average particle size of 35 μm (Example 21) was sprayed to form an intermediate layer having a thickness of 8 μm (Example 20) or 10 μm (Example 21), followed by forming yttrium fluoride thereon. The results of etch depth are shown in Table 5.

TABLE 5

| | Etch depth (μm) |
|---|---|
| Example 20 | <0.1 |
| Example 21 | <0.1 |

Japanese Patent Application Nos. Nos. 2007-313404, 2007-313407 and 2007-313412 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A dummy wafer in a semiconductor fabrication process comprising a substrate and a rare earth fluoride coating disposed on the substrate as an outermost layer, and at least one intermediate layer between the substrate and the rare earth fluoride coating, said substrate being a silicon substrate, said rare earth fluoride being selected from lanthanoid fluorides, yttrium fluoride, and scandium fluoride, and said rare earth fluoride coating being a sprayed coating, and said intermediate layer being silicon.

2. The wafer of claim 1 wherein the lanthanoid comprises one or multiple elements selected from the group consisting of La, Ce, Pr, Nd, Sm, Eu, Gd, Tb, Dy, Ho, Er, Tm, Yb, and Lu.

3. The wafer of claim 1 which is used in a halogen-based gas or plasma atmosphere.

4. A dummy wafer of claim 1 wherein the amounts of impurities in said intermediate layer are as follows:
Fe<100 ppm,
Al<500 ppm,
Ca<100 ppm,
Ni<50 ppm,
Cr<50 ppm,
Zr<50 ppm,
Na<50 ppm, and
K<50 ppm.

5. A dummy wafer in a semiconductor fabrication process comprising a substrate, an intermediate layer disposed on the substrate and a rare earth fluoride coating disposed on the intermediate layer as an outermost layer, said substrate being a silicon substrate, said intermediate layer is a silicon sprayed layer, said rare earth fluoride being selected from lanthanoid fluorides, yttrium fluoride, and scandium fluoride, and said rare earth fluoride coating being a sprayed coating.

* * * * *